(12) United States Patent
Kalnitsky et al.

(10) Patent No.: US 10,096,523 B2
(45) Date of Patent: Oct. 9, 2018

(54) SPACER STRUCTURE AND MANUFACTURING METHOD THEREOF

(71) Applicant: TAIWAN SEMICONDUCTOR MANUFACTURING COMPANY LTD., Hsinchu (TW)

(72) Inventors: Alexander Kalnitsky, San Francisco, CA (US); Kong-Beng Thei, Hsinchu Country (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 218 days.

(21) Appl. No.: 15/061,654

(22) Filed: Mar. 4, 2016

(65) Prior Publication Data

US 2017/0154822 A1   Jun. 1, 2017

Related U.S. Application Data

(60) Provisional application No. 62/261,136, filed on Nov. 30, 2015.

(51) Int. Cl.
*H01L 29/49*    (2006.01)
*H01L 21/8234*  (2006.01)
*H01L 21/02*    (2006.01)
*H01L 21/033*   (2006.01)
*H01L 21/311*   (2006.01)
(Continued)

(52) U.S. Cl.
CPC .. *H01L 21/823468* (2013.01); *H01L 21/0217* (2013.01); *H01L 21/02164* (2013.01); *H01L 21/0332* (2013.01); *H01L 21/31144* (2013.01); *H01L 21/823437* (2013.01); *H01L 27/088* (2013.01); *H01L 21/823864* (2013.01)

(58) Field of Classification Search
CPC ....... H01L 21/823468; H01L 21/02164; H01L 21/0217; H01L 21/0332
See application file for complete search history.

(56) References Cited

U.S. PATENT DOCUMENTS

| 6,806,584 | B2 | 10/2004 | Fung et al. | |
|---|---|---|---|---|
| 2009/0140292 | A1* | 6/2009 | Liu | H01L 21/823412 257/190 |
| 2018/0047754 | A1* | 2/2018 | Basker | H01L 27/1211 |

FOREIGN PATENT DOCUMENTS

| KR | 20040034391 | 4/2004 |
|---|---|---|
| TW | 200709342 | 3/2007 |

* cited by examiner

*Primary Examiner* — Michael Shingleton
(74) *Attorney, Agent, or Firm* — Haynes and Boone, LLP

(57) ABSTRACT

A spacer structure and a fabrication method thereof are provided. The method includes the following operations. First and second conductive structures are formed over a substrate. Dielectric layer is formed to cover the first and second conductive structures. Hard mask layer is formed over the dielectric layer. The hard mask layer covers the dielectric layer over the first conductive structure, and the hard mask layer has an opening exposing the dielectric layer over the second conductive structure. The dielectric layer exposed by the hard mask layer is etched to reduce thickness of the dielectric layer. The hard mask layer is removed. The dielectric layer is etched to form first main spacer on sidewall of the first conductive structure and second main spacer on sidewall of the second conductive structure. A first width of the first main spacer is greater than a second width of the second main spacer.

20 Claims, 20 Drawing Sheets

(51) Int. Cl.
*H01L 27/088* (2006.01)
*H01L 21/8238* (2006.01)

SPACER STRUCTURE AND MANUFACTURING METHOD THEREOF

CROSS-REFERENCE TO RELATED APPLICATION

This application claims priority of U.S. provisional application Ser. No. 62/261,136 filed on 30 Nov. 2015, which is incorporated by reference in its entirety.

BACKGROUND

Spacer is a dielectric formed alongside the gate electrode of a metal-oxide-semiconductor field effect transistor (MOSFET) device. In addition to protect the gate electrode, the spacer is also configured to allow the formation of source/drain regions and/or lightly doped drain (LDD).

In MOSFET devices, leakage currents need to be reduced in order to save power consumption. One of the leakage components in MOSFET devices is gate-induced drain leakage (GIDL), which is caused by trap assisted band-to-band tunneling at the surface of the drain region where the gate electrode overlaps the drain region. GIDL is sensitive to many factors such as the thickness of gate dielectric, the dopant concentration of drain region, and the applied gate voltage, as well as the width of spacer. As the complexity and application of integrated circuit increase, there are more challenges to suppress leakage current among different MOSFET devices.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
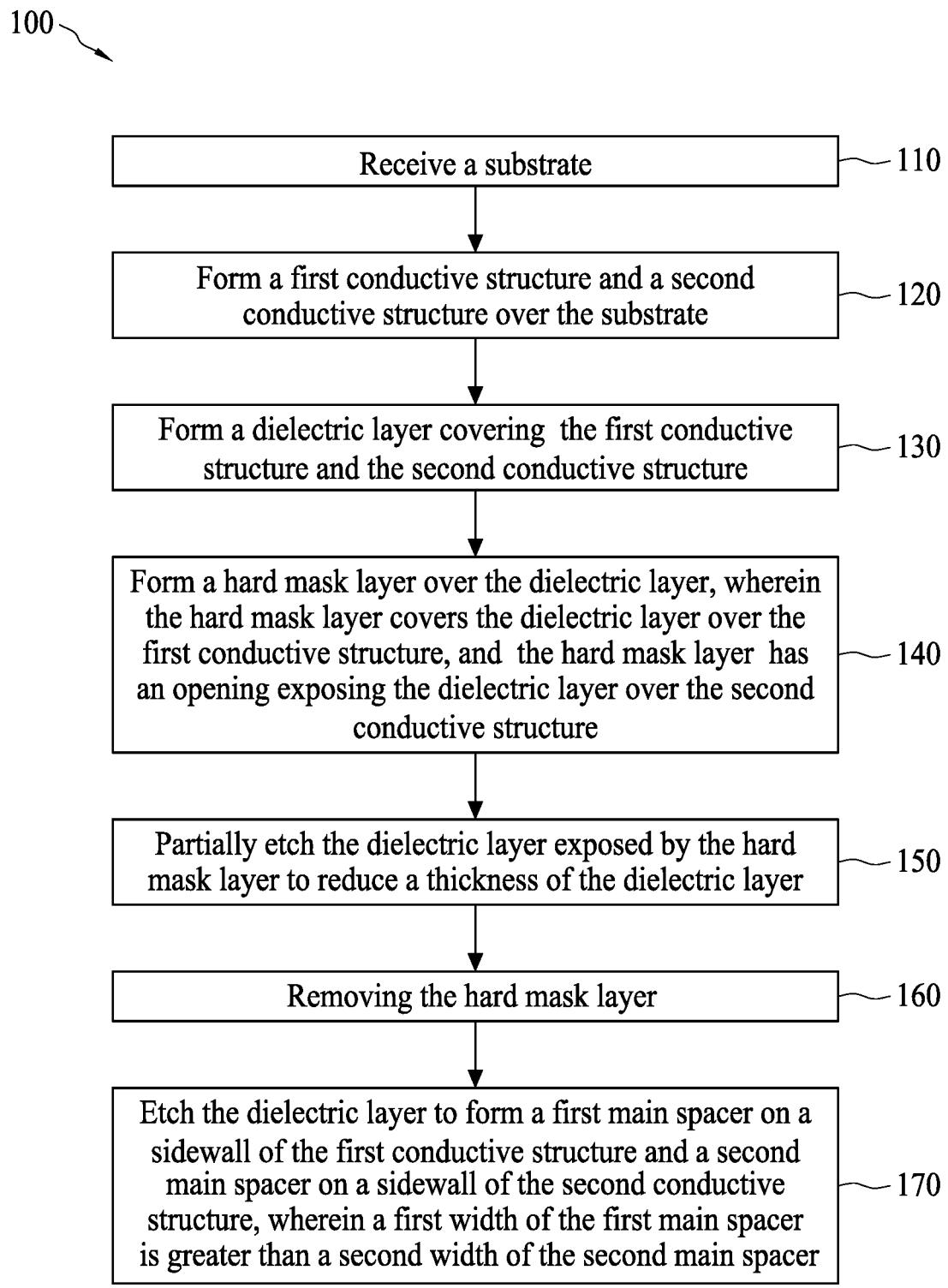
FIG. 1 is a flow chart illustrating a method for manufacturing a spacer structure according to various aspects of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

In the present disclosure, a spacer structure having spacers with different widths are fabricated with the same dielectric layer. The spacer structure of the present disclosure is self-aligned, less complex and compatible with standard integrated circuit fabrication. The spacer structure having spacers with different widths are configured as side spacers of devices to meet diverse requirements in different applications.

FIG. 1 is a flow chart illustrating a method for manufacturing a spacer structure according to various aspects of the present disclosure. The method 100 begins with operation 110 in which a substrate is received. The method 100 continues with operation 120 in which a first conductive structure and a second conductive structure are formed over the substrate. The method 100 proceeds with operation 130 in which a dielectric layer is formed to cover the first conductive structure and the second conductive structure. The method 100 continues with operation 140 in which a hard mask layer is formed over the dielectric layer, wherein the hard mask layer covers the dielectric layer over the first conductive structure, and the hard mask layer has an opening exposing the dielectric layer over the second conductive structure. The method 100 continues with operation 150 in which the dielectric layer exposed by the hard mask layer is etched to reduce a thickness of the dielectric layer. The method 100 proceeds with operation 160 in which the hard mask layer is removed. The method 100 proceeds with operation 170 in which the dielectric layer is etched to form a first main spacer on a sidewall of the first conductive structure and a second main spacer on a sidewall of the second conductive structure, wherein a first width of the first main spacer is greater than a second width of the second main spacer.

The method 100 is merely an example, and is not intended to limit the present disclosure beyond what is explicitly recited in the claims. Additional operations can be provided before, during, and after the method 100, and some operations described can be replaced, eliminated, or moved around for additional embodiments of the method.

Figure 2A:
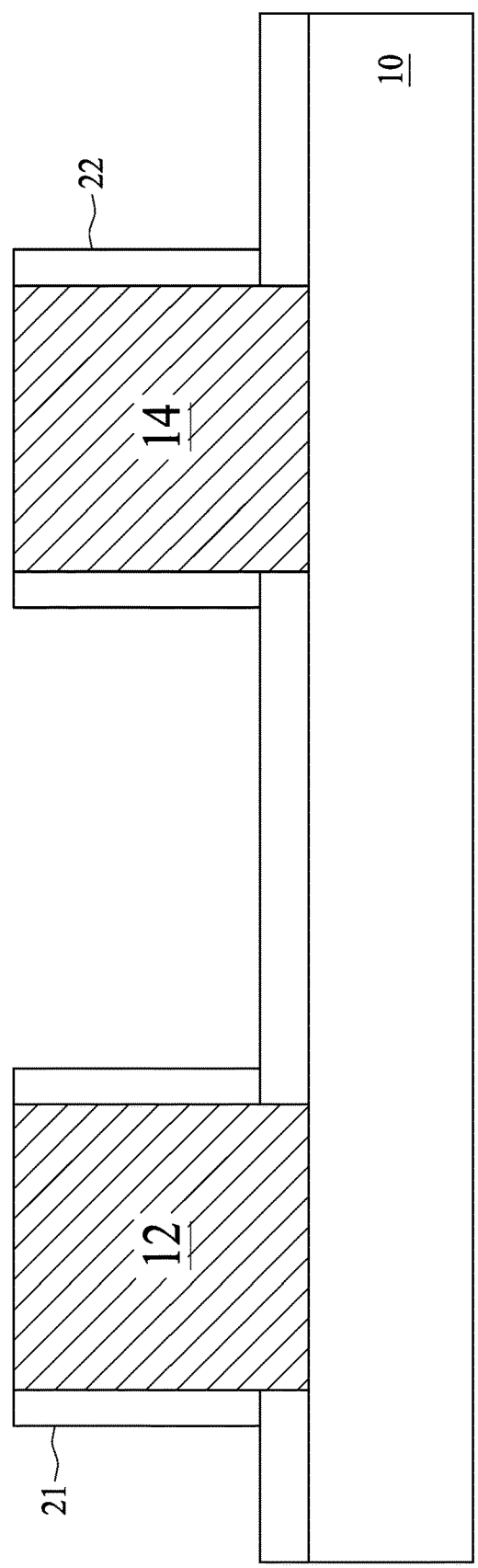
FIGS. 2A, 2B, 2C, 2D, 2E, and 2F are cross-sectional views at one of various operations of manufacturing a spacer structure according to some embodiments of the present disclosure.

FIGS. 2A, 2B, 2C, 2D, 2E, and 2F are cross-sectional views at one of various operations of manufacturing a spacer structure according to some embodiments of the present disclosure. As depicted in FIG. 2A and operation 110 in FIG. 1, the method 100 begins at operation 110 in which a substrate 10 is received. The substrate 10 includes a wafer over which devices such as semiconductor devices or other devices are to be formed. In some embodiments, the substrate 10 includes a semiconductor substrate, such as a bulk semiconductor substrate. The bulk semiconductor substrate includes an elementary semiconductor, such as silicon or germanium; a compound semiconductor, such as silicon germanium, silicon carbide, gallium arsenic, gallium phosphide, indium phosphide, or indium arsenide; or combinations thereof. In some embodiments, the substrate 10 includes a multilayered substrate, such as a silicon-on-insulator (SOI) substrate, which includes a bottom semiconductor layer, a buried oxide layer (BOX) and a top semiconductor layer.

As depicted in FIG. 2A and operation 120 in FIG. 1, the method 100 continues with operation 120 in which a first conductive structure 12 and a second conductive structure 14 are formed over the substrate 10. In some embodiments, the first conductive structure 12 and the second conductive structure 14 are gate electrodes of different transistor devices such as gate electrodes of MOSFET devices. The first conductive structure 12 and the second conductive structure 14 may be formed of metal or alloy, doped semiconductor material such as doped polycrystalline silicon, a combination thereof, or any other suitable conductive material. In some alternative embodiments, the first conductive structure 12 and the second conductive structure 14 may be replaced with dielectric structures. The first conductive structure 12 and the second conductive structure 14 may be single-layered structures or multi-layered structures. The first conductive structure 12 and the second conductive structure 14 may be equal or different in size.

In some embodiments, a first liner spacer 21 is optionally formed on a sidewall of the first conductive structure 12 and a second liner spacer 22 is optionally formed on a sidewall of the second conductive structure 14. In some embodiments, the first liner spacer 21 and the second liner spacer 22 are formed of the same dielectric layer. By way of example, the first liner spacer 21 and the second liner spacer 22 are formed of silicon oxide. The first liner spacer 21 and the second liner spacer 22, however, may be formed of silicon nitride, silicon oxynitride or any other suitable dielectric materials. In some embodiments, the width of the first liner spacer 21 is substantially equal to the width the second liner spacer 22. In some embodiments, the first liner spacer 21 and the second liner spacer 22 are substantially conformal to the sidewalls of the first conductive structure 12 and the second conductive structure 14, respectively.

Figure 2B:
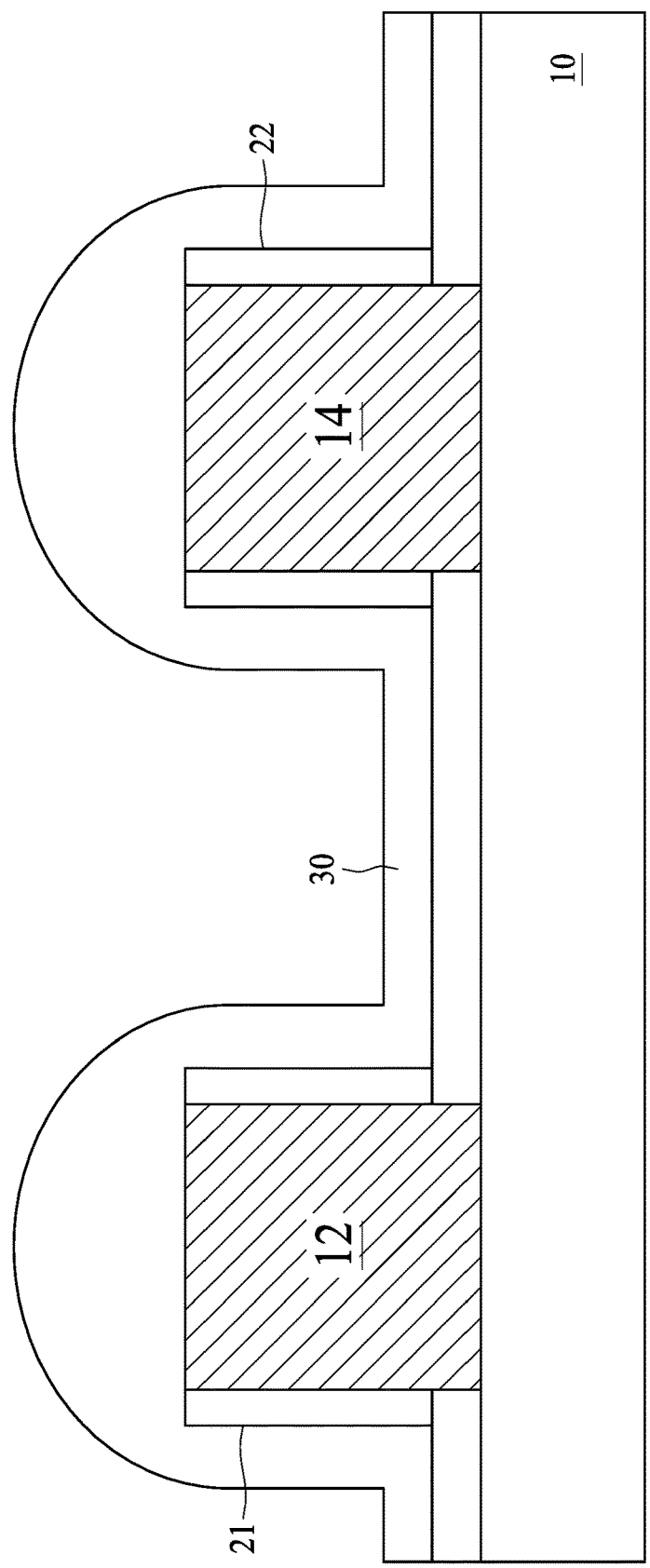

As depicted in FIG. 2B and operation 130 in FIG. 1, the method 100 continues with operation 130 in which a dielectric layer 30 is formed to cover the first conductive structure 12 and the second conductive structure 14. In some embodiments, the dielectric layer 30 covers the top surfaces of the first conductive structure 12 and the second conductive structure 14, and the lateral surfaces of the first liner spacer 21 and the second liner spacer 22. In some alternative embodiments, the first liner spacer 21 and the second liner spacer 22 are not present, and the dielectric layer 30 covers the sidewalls of the first conductive structure 12 and the second conductive structure 14. In some embodiments, the dielectric layer 30 includes silicon nitride. However, the dielectric layer 30 may be formed of silicon oxide, silicon oxynitride or any other suitable dielectric materials.

Figure 2C:
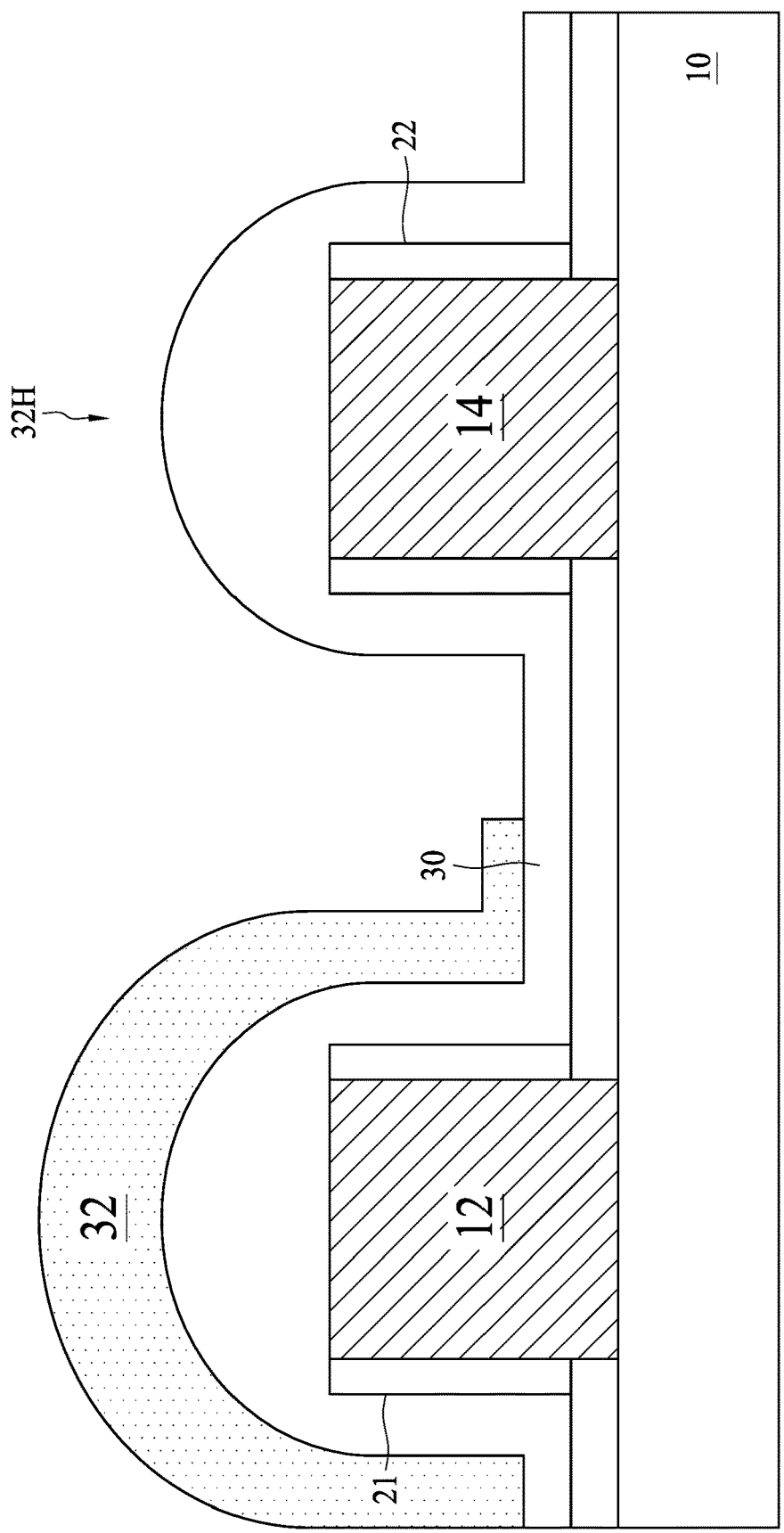

As depicted in FIG. 2C and operation 140 in FIG. 1, the method 100 continues with operation 140 in which a hard mask layer 32 is formed over the dielectric layer 30. The hard mask layer 32 covers the dielectric layer 30 over the first conductive structure 12, and the hard mask layer 32 has an opening 32H exposing the dielectric layer 30 over the second conductive structure 14. The hard mask layer 32 may be patterned by any suitable patterning techniques. For example, the hard mask layer 32 may be patterned by lithography using a photoresist layer (not shown) to form the opening 32H. The hard mask layer 32 is configured as a hard mask to pattern the dielectric layer 30. In some embodiments, the hard mask layer 32 includes silicon oxide. The photoresist layer is then removed after the hard mask layer 32 is patterned. The hard mask layer 32 may be formed of any suitable materials different from that of the dielectric layer 30. In some alternative embodiments, the hard mask layer 32 may be a resist layer such as a photoresist layer, and patterned by photolithography or any other suitable patterning techniques.

Figure 2D:
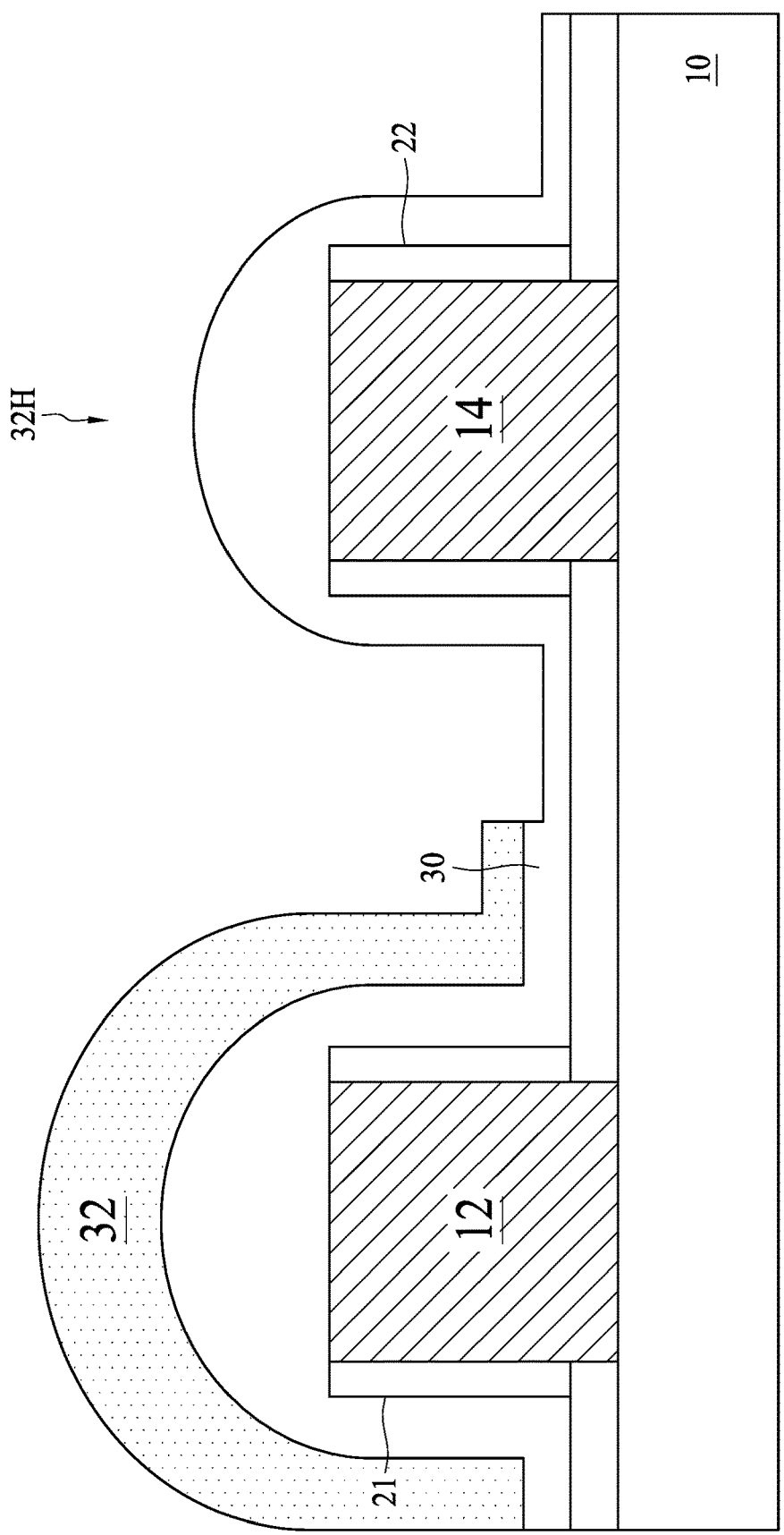

As depicted in FIG. 2D and operation 150 in FIG. 1, the method 100 continues with operation 150 in which the dielectric layer 30 exposed by the hard mask layer 32 is etched to reduce a thickness of the dielectric layer 30, while the thickness of the dielectric layer 30 blocked by the hard mask layer 32 is preserved. In operation 150, the exposed dielectric layer 30 is partially etched but not etched through, and thus the thickness of the dielectric layer 30 over the second conductive structure 14 will be less than the thickness of the dielectric layer 30 over the first conductive structure 12. In some embodiments, operation 150 is achieved by anisotropic etching such as dry etching. In some embodiments, operation 150 may also be achieved by isotropic etching such as wet etching, or a combination of anisotropic etching and isotropic etching. In some embodiments, the wet etching is carried out using a phosphoric acid as an etching solution. The anisotropic etching or the isotropic etching may be implemented by any known and suitable etching techniques.

Figure 2E:
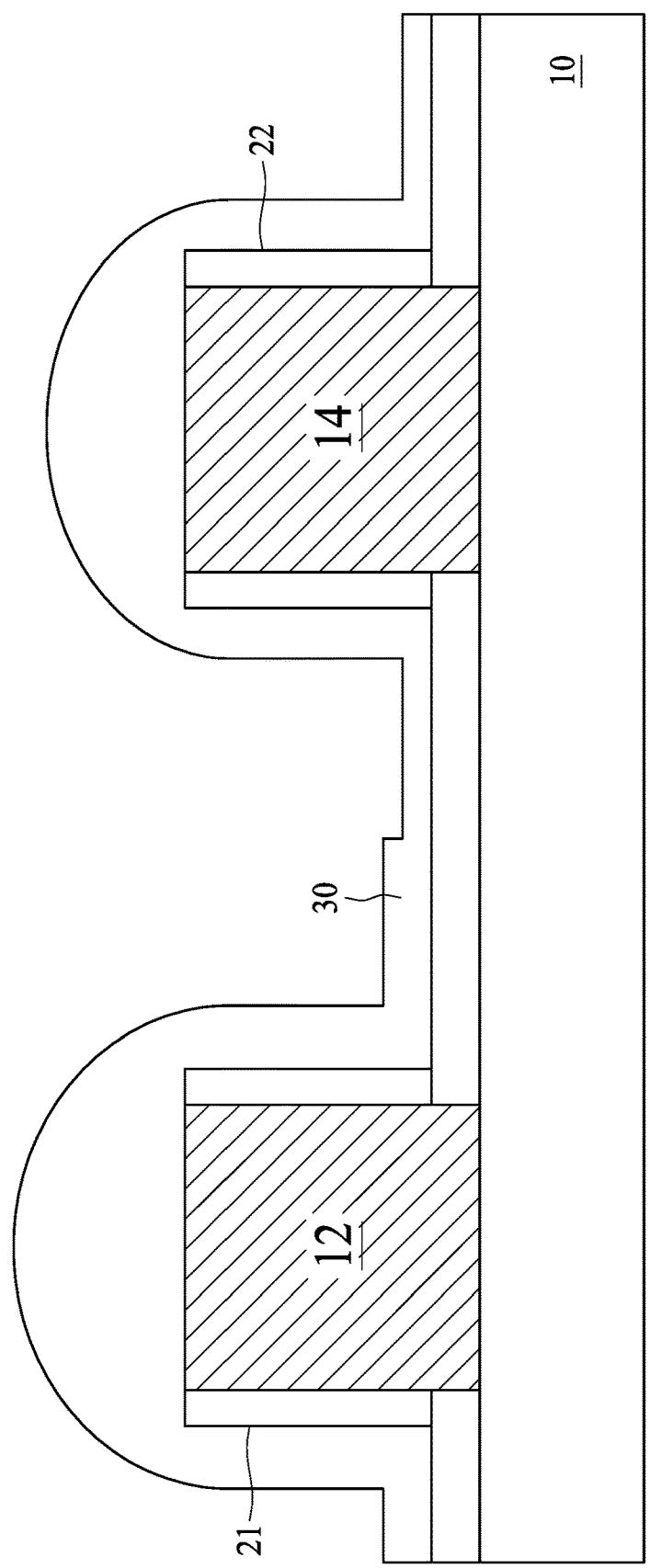

As depicted in FIG. 2E and operation 160 in FIG. 1, the method 100 proceeds with operation 160 in which the hard mask layer 32 is removed.

Figure 2F:
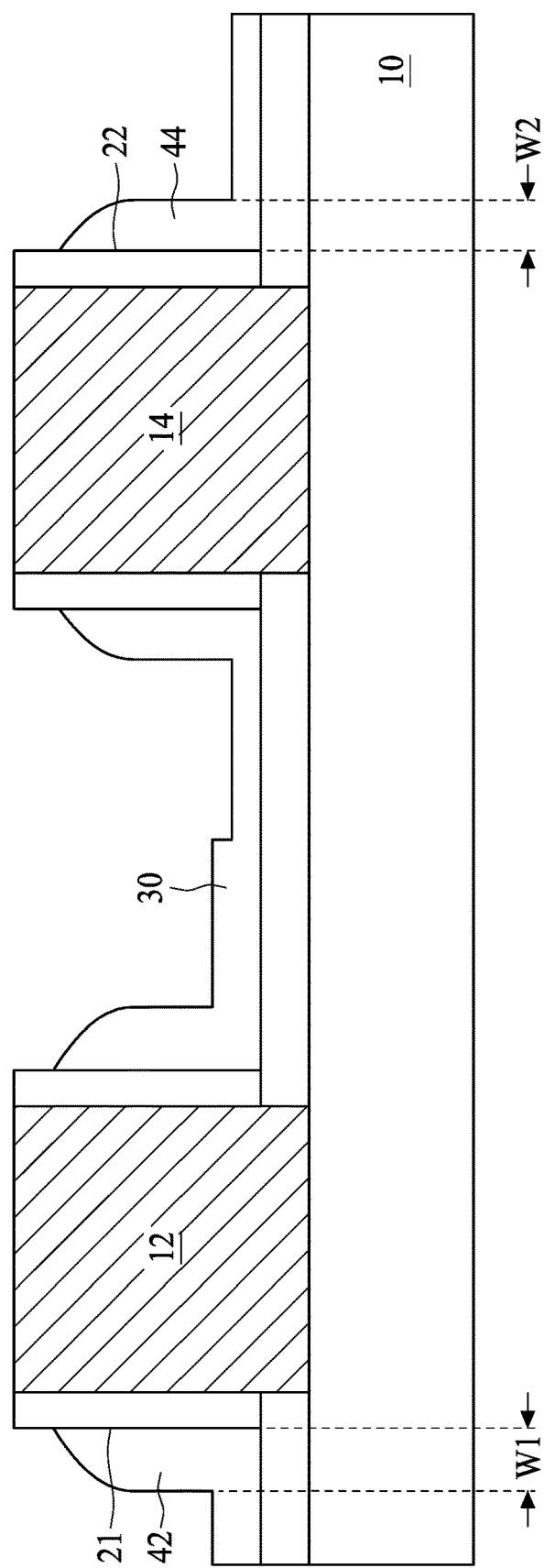

As depicted in FIG. 2F and operation 170 in FIG. 1, the method 100 proceeds with operation 170 in which the dielectric layer 30 is etched to form a first main spacer 42 on the sidewall of the first conductive structure 12 and a second main spacer 44 on the sidewall of the second conductive structure 14. In operation 170, the dielectric layer 30 is etched without being blocked by hard mask layer, and thus the dielectric layer 30 over both the first conductive structure 12 and the second conductive structure 14 is etched. As described, the thickness of the dielectric layer 30 over the second conductive structure 14 is reduced to be less than the thickness of the dielectric layer 30 over the first conductive structure 12 in operation 150, and this thickness difference still exists after operation 170 for the dielectric layer 30 over the first conductive structure 12 and the dielectric layer 30 over the second conductive structure 14 are substantially equally etched. Accordingly, a first width W1 of the first main spacer 42 is greater than a second width W2 of the second main spacer 44. In the present embodiment, the first and second main spacers 42 and 44 are disposed by the sidewalls of the first and second conductive structures 12 and 14 respectively with the first and second liner spacers 21 and 22 formed therebetween. In some alternative embodiments, the first and second liner spacers 21 and 22 may be omitted, and the first and second main spacers 42 and 44 may be in contact with the sidewalls of the first and second conductive structures 12 and 14 respectively.

In some embodiment, the dielectric layer 30 disposed over the first conductive structure 12 and the dielectric layer 30 over the second conductive structure 14 are also etched off in operation 170 to expose the top surface of the first conductive structure 12 and the top surface of the second conductive structure 14. In some embodiments, the dielectric layer 30 disposed over the first conductive structure 12 and the dielectric layer 30 over the second conductive structure 14 are etched off by another etching operation. Alternatively, the dielectric layer 30 disposed over the first conductive structure 12 and the dielectric layer 30 over the second conductive structure 14 may be reserved.

The structure and manufacturing method of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 3:
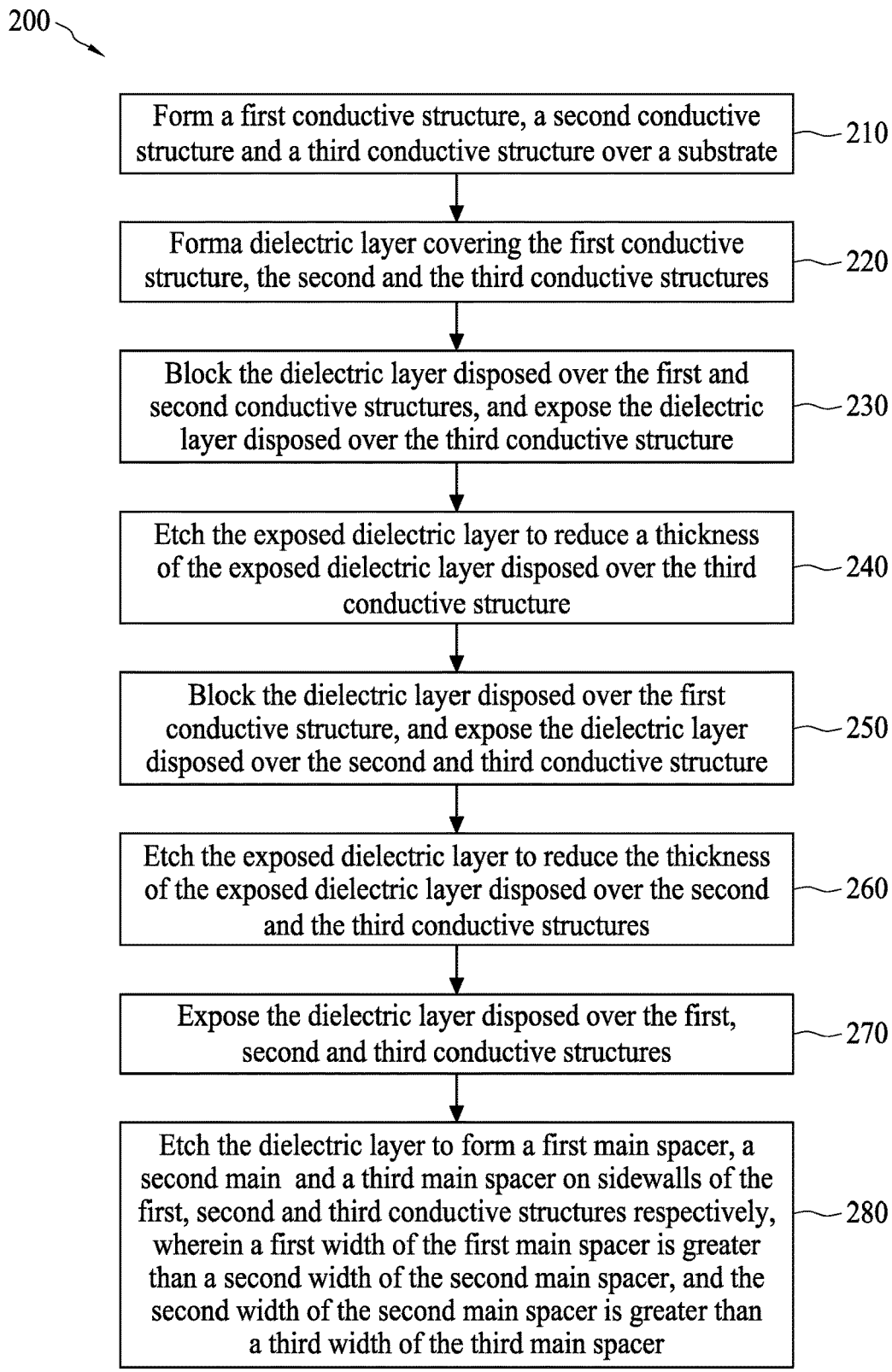
FIG. 3 is a flow chart illustrating a method for manufacturing a spacer structure according to various aspects of the present disclosure.

FIG. 3 is a flow chart illustrating a method for manufacturing a spacer structure according to various aspects of the present disclosure. The method 200 begins with operation 210 in which a first conductive structure, a second conductive structure and a third conductive structure are formed over a substrate. The method 200 continues with operation 220 in which a dielectric layer is formed to cover the first conductive structure, the second conductive structure and the third conductive structure. The method 200 proceeds with operation 230 in which the dielectric layer disposed over the first conductive structure and the second conductive structure is blocked, and the dielectric layer disposed over the third conductive structure is exposed. The method 200 continues with operation 240 in which the exposed dielectric layer is etched to reduce a thickness of the exposed dielectric layer disposed over the third conductive structure. The method 200 continues with operation 250 in which the dielectric layer disposed over the first conductive structure is blocked, and the dielectric layer disposed over the second conductive structure and the third conductive structure is exposed. The method 200 proceeds with operation 260 in which the exposed dielectric layer is etched to reduce the thickness of the exposed dielectric layer disposed over the second conductive structure and the third conductive structure. The method 200 proceeds with operation 270 in which the dielectric layer disposed over the first conductive structure, the second conductive structure and the third conductive structure is exposed. The method 200 continues with operation 280 in which the dielectric layer is etched to form a first main spacer on a sidewall of the first conductive structure, a second main spacer on a sidewall of the second conductive structure, and a third main spacer on a sidewall of the third conductive structure, wherein a first width of the first main spacer is greater than a second width of the second main spacer, and the second width of the second main spacer is greater than a third width of the third main spacer.

The method 200 is merely an example, and is not intended to limit the present disclosure beyond what is explicitly recited in the claims. Additional operations can be provided before, during, and after the method 200, and some operations described can be replaced, eliminated, or moved around for additional embodiments of the method.

Figure 4A:
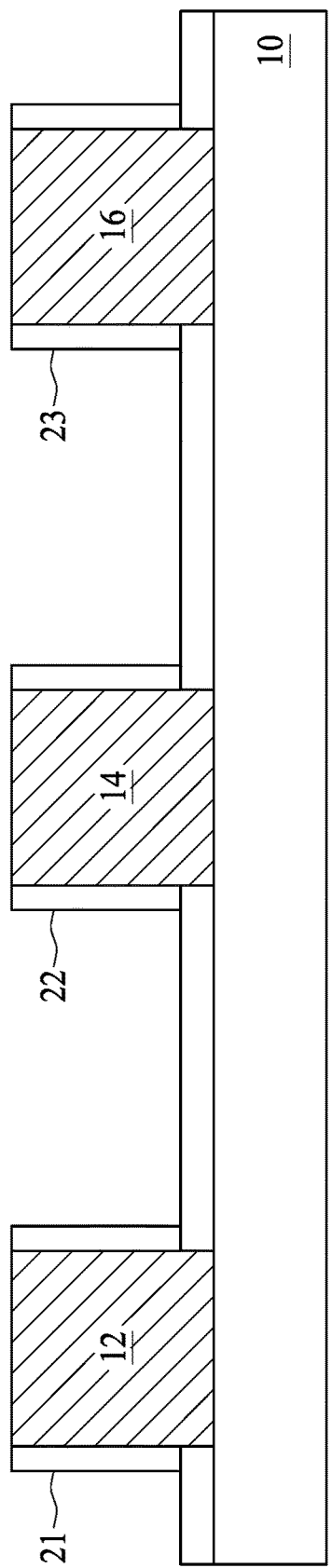
FIGS. 4A, 4B, 4C, 4D, 4E, 4F, 4G and 4H are cross-sectional views at one of various operations of manufacturing a spacer structure according to some embodiments of the present disclosure.

FIGS. 4A, 4B, 4C, 4D, 4E, 4F, 4G and 4H are cross-sectional views at one of various operations of manufacturing a spacer structure according to some embodiments of the present disclosure. As depicted in FIG. 4A and operation 210 in FIG. 3, the method 200 begins with operation 210 in which a first conductive structure 12, a second conductive structure 14 and a third conductive structure 16 are formed over a substrate 10. In some embodiments, the first conductive structure 12, the second conductive structure 14 and the third conductive structurer 16 are gate electrodes of different transistor devices such as gate electrodes of MOSFET devices. The first, second and third conductive structures 12, 14 and 16 may be formed of metal or alloy, doped semiconductor material such as doped polycrystalline silicon, a combination thereof, or any other suitable conductive material. In some alternative embodiments, the first, second and third conductive structures 12, 14 and 16 may be replaced with dielectric structures. The first, second and third conductive structures 12, 14 and 16 may be single-layered structures or multi-layered structures.

In some embodiments, a first liner spacer 21, a second liner spacer 22 and a third liner spacer 23 are optionally formed on sidewalls of the first conductive structure 12, the second conductive structure 14 and the third conductive structure 16, respectively. In some embodiments, the first, second and third liner spacer 21, 22 and 23 are formed of the same dielectric layer. By way of example, the first, second and third liner spacer 21, 22 and 23 are formed of silicon oxide, silicon nitride, silicon oxynitride or any other suitable dielectric materials. In some embodiments, the widths of the first, second and third liner spacer 21, 22 and 23 are substantially the same.

Figure 4B:
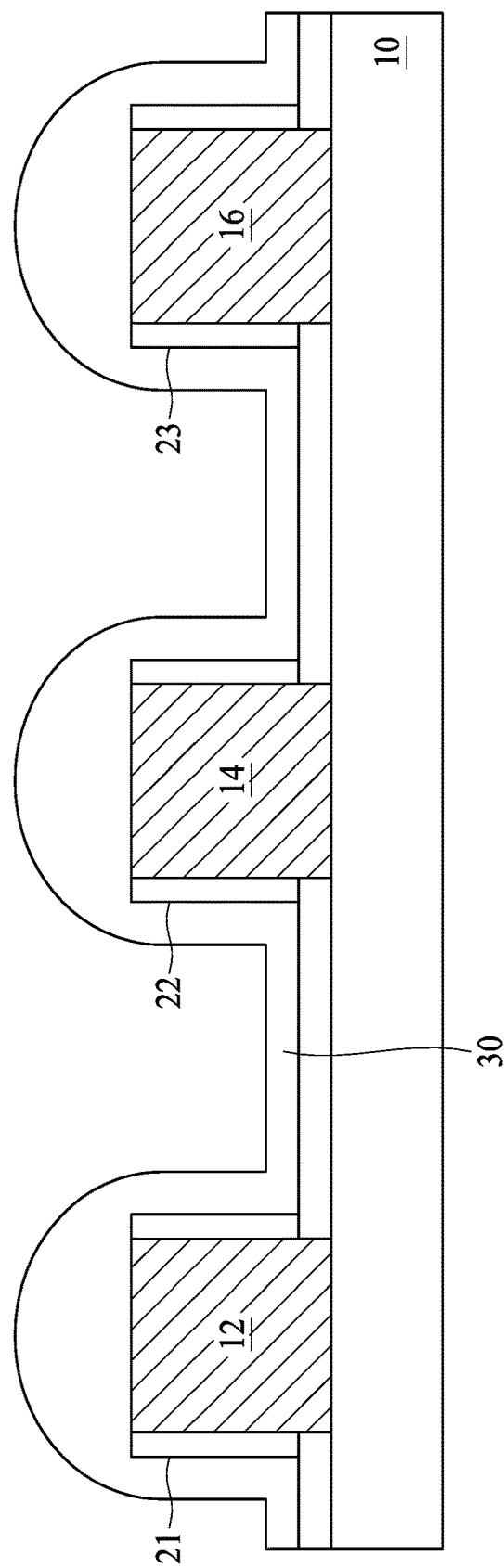

As depicted in FIG. 4B and operation 220 in FIG. 3, the method 200 continues with operation 220 in which a dielectric layer 30 is formed to cover the first conductive structure 12, the second conductive structure 14 and the third conductive structure 16. In some embodiments, the dielectric layer 30 covers the top surfaces of the first, second and third conductive structures 12, 14 and 16, and the lateral surfaces of the first, second and third liner spacer 21, 22 and 23. In some embodiments, the dielectric layer 30 includes silicon nitride, silicon oxide, silicon oxynitride or any other suitable dielectric materials.

Figure 4C:
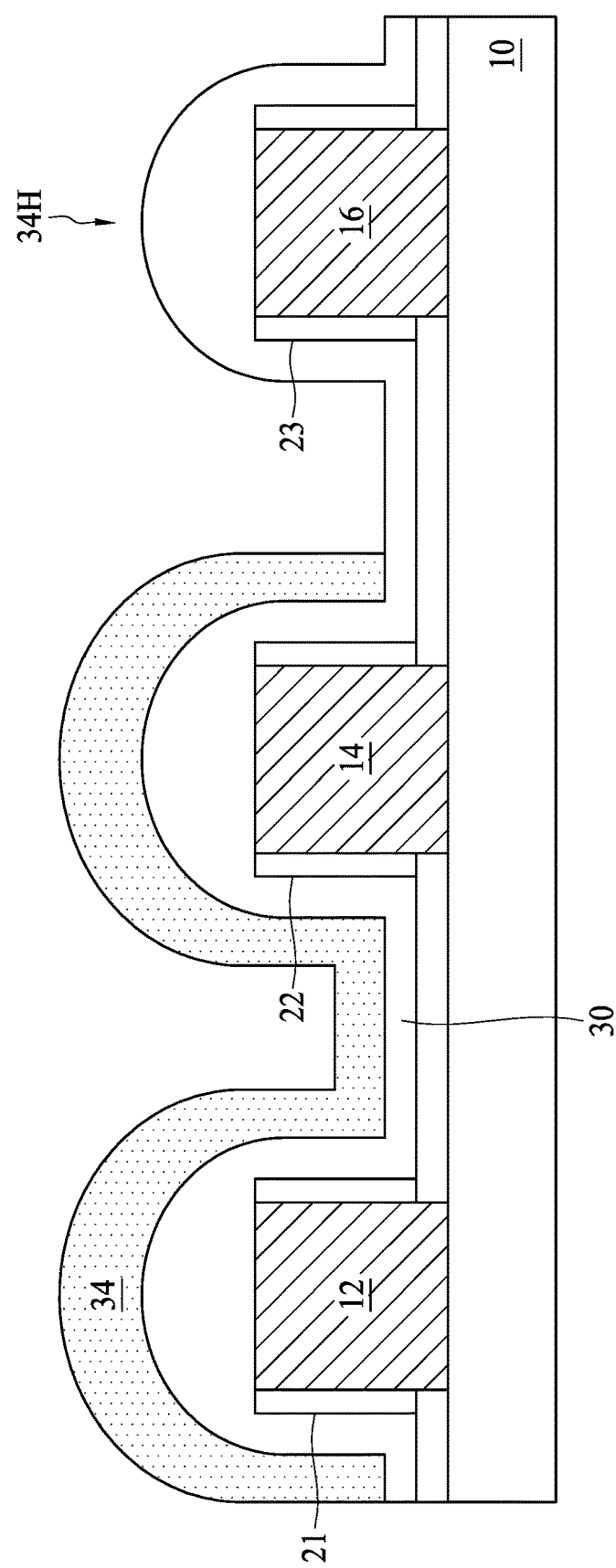

As depicted in FIG. 4C and operation 230 in FIG. 3, the method 200 proceeds with operation 230 in which the dielectric layer 30 disposed over the first conductive structure 12 and the second conductive structure 14 is blocked, and the dielectric layer 30 disposed over the third conductive structure 16 is exposed. In some embodiments, the dielectric layer 30 disposed over the first conductive structure 12 and the second conductive structure 14 is blocked by forming a first hard mask layer 34 over the dielectric layer 30. The first hard mask layer 34 has an opening 34H exposing the dielectric layer 30 disposed over the third conductive structure 16. The first hard mask layer 34 may be patterned by any suitable patterning techniques. For example, the first hard mask layer 34 may be patterned by lithography using a photoresist layer (not shown) to form the opening 34H. The first hard mask layer 34 is configured as a hard mask to pattern the dielectric layer 30. In some embodiments, the first hard mask layer 34 includes silicon oxide. The first hard mask layer 34 may be formed of any suitable materials different from that of the dielectric layer 30. In some embodiments, the first hard mask layer 34 may be a resist layer such as a photoresist layer, and patterned by photolithography or any other suitable patterning techniques.

Figure 4D:
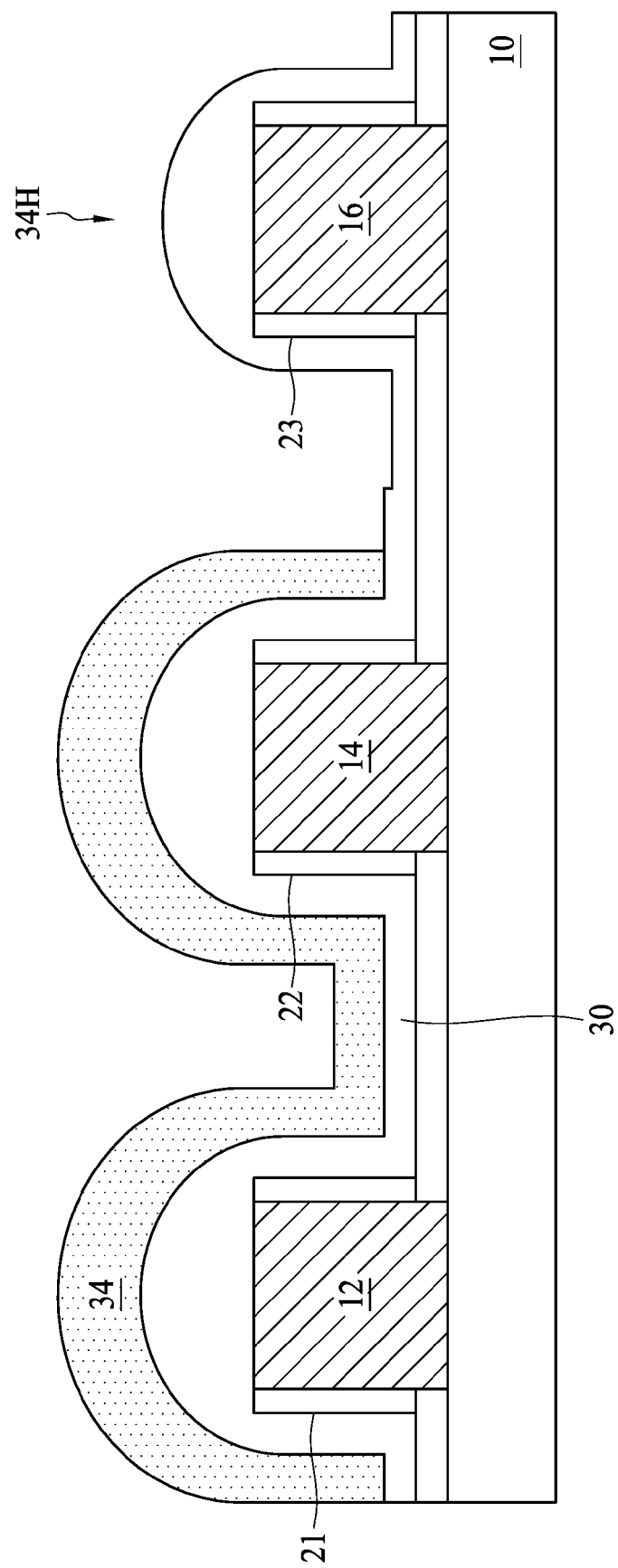

As depicted in FIG. 4D and operation 240 in FIG. 3, the method 200 continues with operation 240 in which the exposed dielectric layer 30 is etched to reduce a thickness of the exposed dielectric layer 30 disposed over the third conductive structure 16, while the thickness of the dielectric layer 30 blocked by the first hard mask layer 34 is preserved. In operation 240, the exposed dielectric layer 30 is partially etched but not etched through, and thus the thickness of the dielectric layer 30 over the third conductive structure 16 will be less than the thickness of the dielectric layer 30 over the first conductive structure 12 and the second conductive structure 14. In some embodiments, operation 240 is achieved by anisotropic etching such as dry etching. In some embodiments, operation 240 may also be achieved by isotropic etching such as wet etching, or a combination of anisotropic etching and isotropic etching. The anisotropic etching and the isotropic etching may be implemented by any known and suitable etching techniques.

Figure 4E:
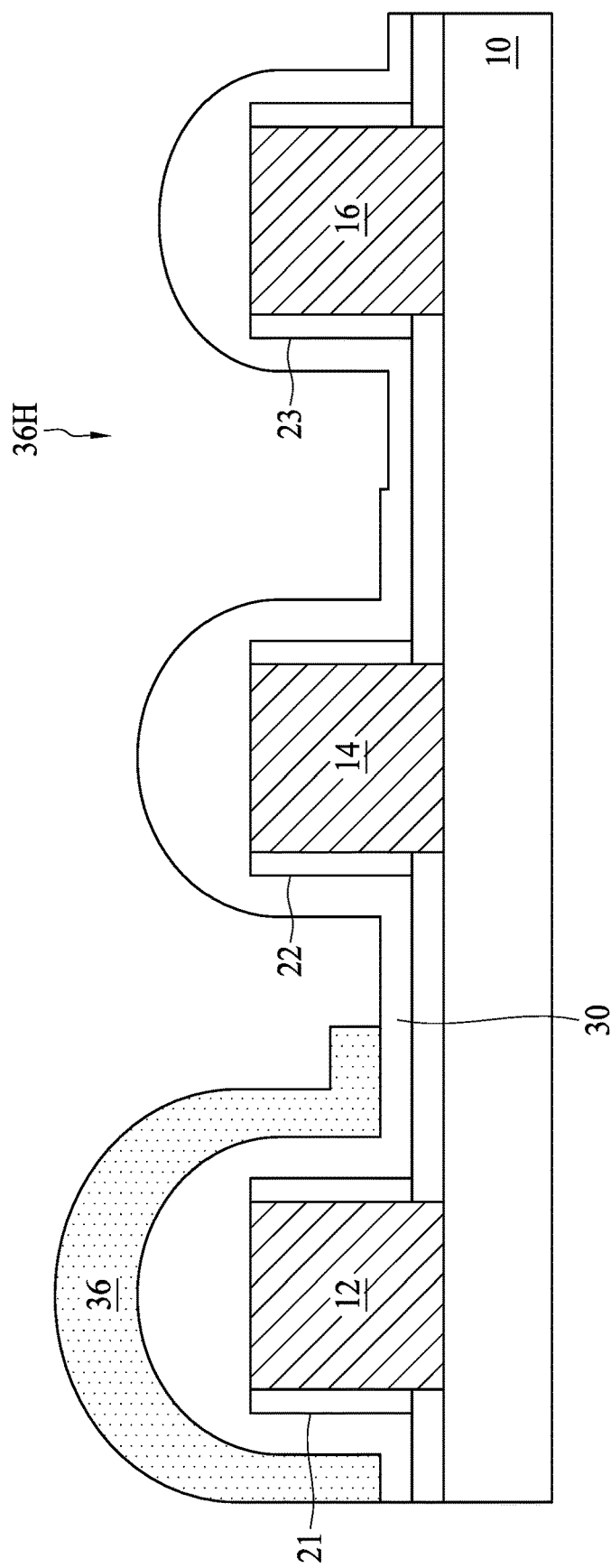

As depicted in FIG. 4E and operation 250 in FIG. 3, the method 200 continues with operation 250 in which the dielectric layer 30 disposed over the first conductive structure 12 is blocked, and the dielectric layer 30 disposed over the second conductive structure 14 and the third conductive structure 16 is exposed. In some embodiments, operation 250 is achieved by removing the first hard mask layer 34 and forming a second hard mask layer 36 over the dielectric layer 30. The second hard mask layer 36 has an opening 36H exposing the dielectric layer 30 disposed over the second conductive structure 14 and third conductive structure 16. The material and formation of the second mask layer 36 may be the same as those of the first mask layer 34, but not limited thereto.

Figure 4F:
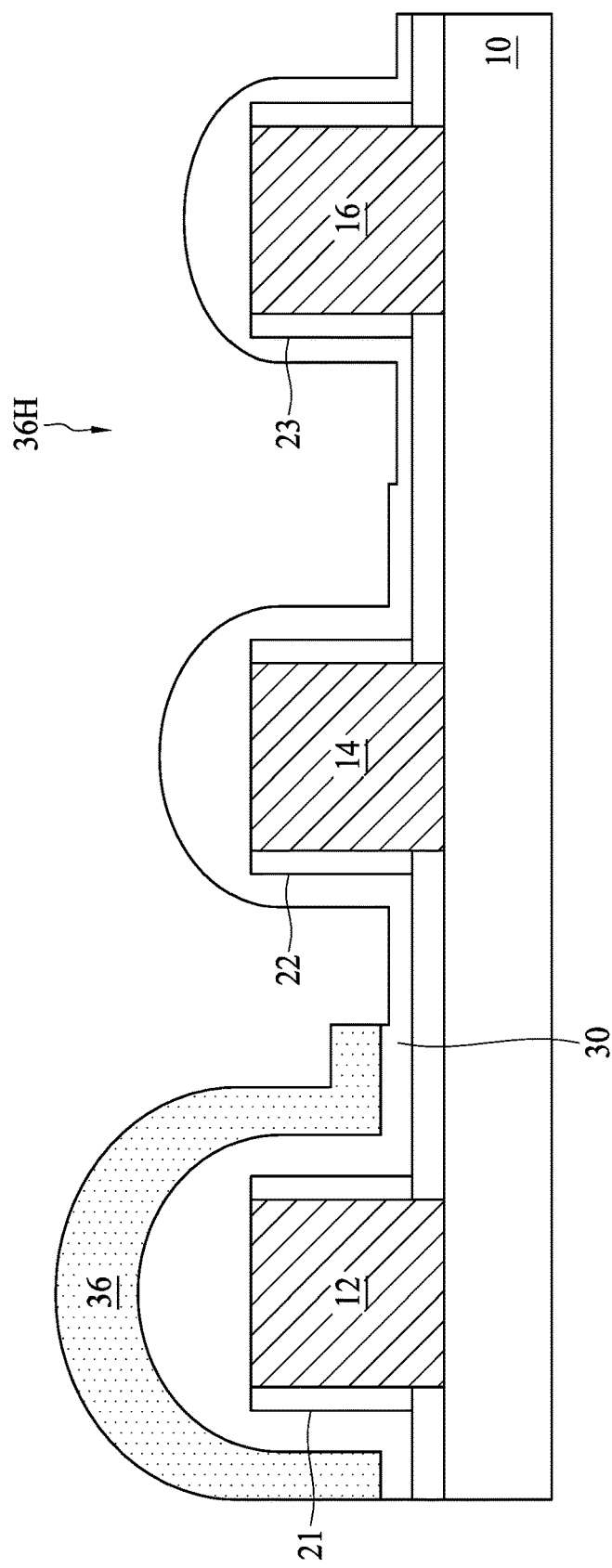

As depicted in FIG. 4F and operation 260 in FIG. 3, the method 200 proceeds with operation 260 in which the exposed dielectric layer 30 is etched to reduce the thickness of the exposed dielectric layer 30 disposed over the second conductive structure 14 and the third conductive structure 16, while the thickness of the dielectric layer 30 blocked by the second hard mask layer 36 is preserved. In operation 260, the exposed dielectric layer 30 is partially etched but not etched through, and thus the thickness of the dielectric layer 30 over the second conductive structure 14 will be less than the thickness of the dielectric layer 30 over the first conductive structure 12. In addition, the thickness of the dielectric layer 30 over the third conductive structure 16 will be less than the thickness of the dielectric layer 30 over the second conductive structure 14, because the dielectric layer 30 over the third conductive structure 16 has been etched in operation 240. In some embodiments, operation 260 is achieved by anisotropic etching such as dry etching. In some embodiments, operation 240 may also be achieved by isotropic etching such as wet etching, or a combination of anisotropic etching and isotropic etching. The anisotropic etching and the isotropic etching may be carried out any known and suitable etching techniques.

Figure 4G:
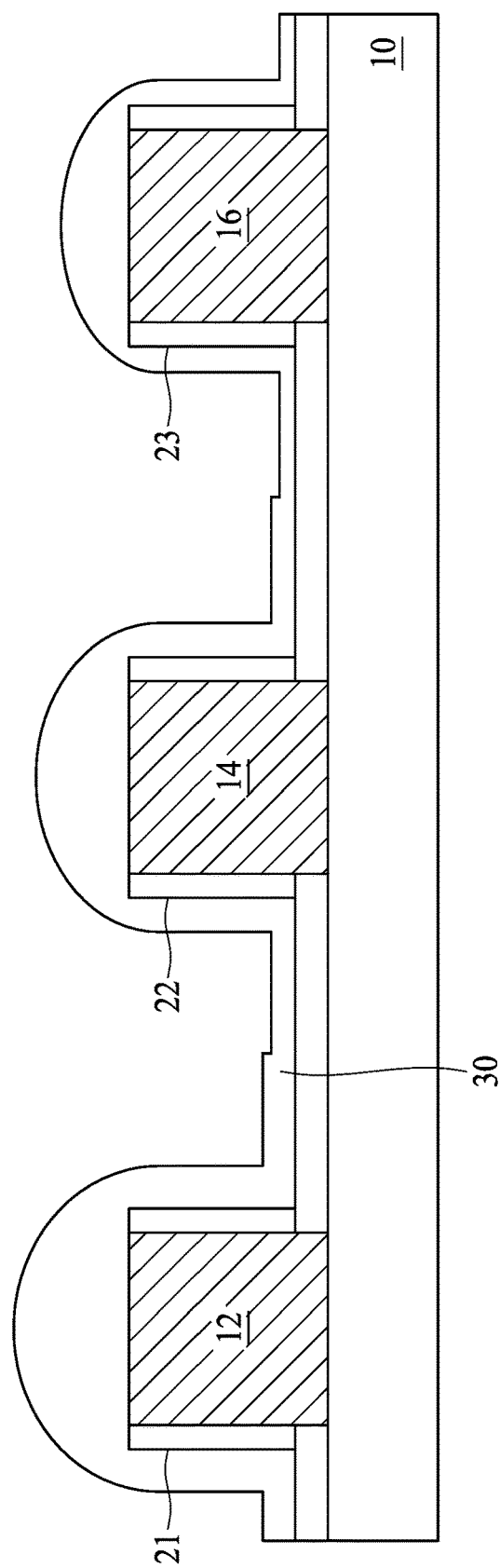

As depicted in FIG. 4G and operation 270 in FIG. 3, the method 200 proceeds with operation 270 in which the dielectric layer 30 disposed over the first conductive structure 12, the second conductive structure 14 and the third conductive structure 16 is exposed. In some embodiments, operation 270 is achieved by removing the second hard mask layer 36.

Figure 4H:
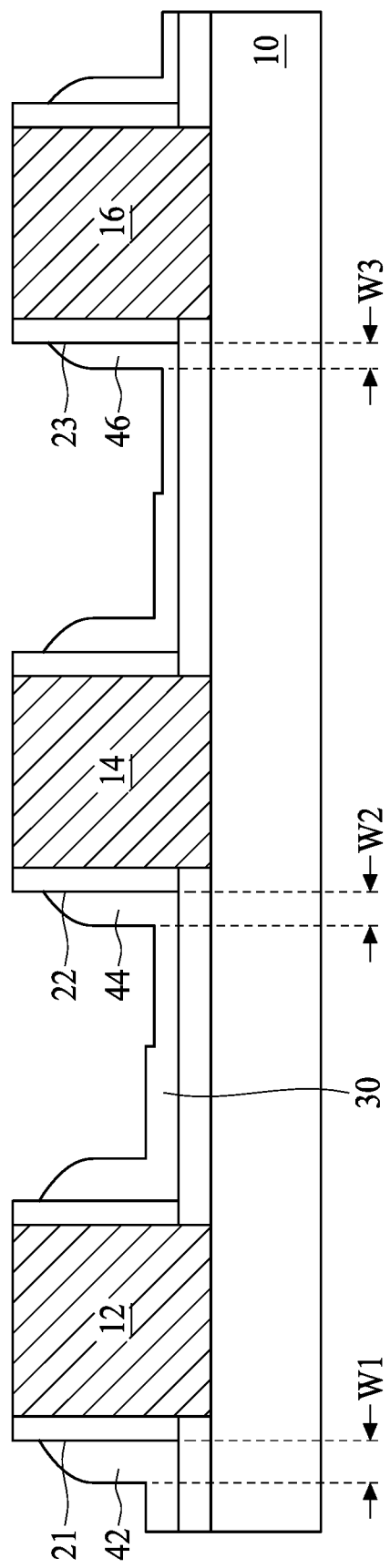

As depicted in FIG. 4H and operation 280 in FIG. 3, the method 200 continues with operation 280 in which the dielectric layer 30 is etched to form a first main spacer 42 on the sidewall of the first conductive structure 12, a second main spacer 44 on the sidewall of the second conductive structure 14, and a third main spacer 46 on the sidewall of the third conductive structure 16. In operation 280, the dielectric layer 30 is etched without being blocked by hard mask layer, and thus the dielectric layer 30 over the first conductive structure 12, the second conductive structure 14 and the third conductive structure 16 is substantially evenly etched. The thickness of the dielectric layer 30 over the second conductive structure 14 is reduced in operation 260, and the thickness of the dielectric layer 30 over the third conductive structure 16 is reduced in operations 240 and 260. These thickness differences among different portions of the dielectric layer 30 still exist after operation 280 for the dielectric layer 30 over the first, second and third conductive structures 12, 14 and 16 are substantially evenly etched. Accordingly, the first width W1 of the first main spacer 42 is greater than the second width W2 of the second main spacer 44, and the second width W2 of the second main spacer 44 is greater than the third width of the third main spacer 46.

In some embodiment, the dielectric layer 30 disposed over the first conductive structure 12, the second conductive structure 14 and the third conductive structure 16 is also etched off in operation 280 to expose the top surfaces of the first conductive structure 12, the second conductive structure 14 and the third conductive structure 16. In some embodiments, the dielectric layer 30 disposed over the first conductive structure 12, the second conductive structure 14 and the third conductive structure 16 is etched off by another etching operation. Alternatively, the dielectric layer 30 disposed over the first conductive structure 12, the second conductive structure 14 and the third conductive structure 16 may be reserved.

Figure 5A:
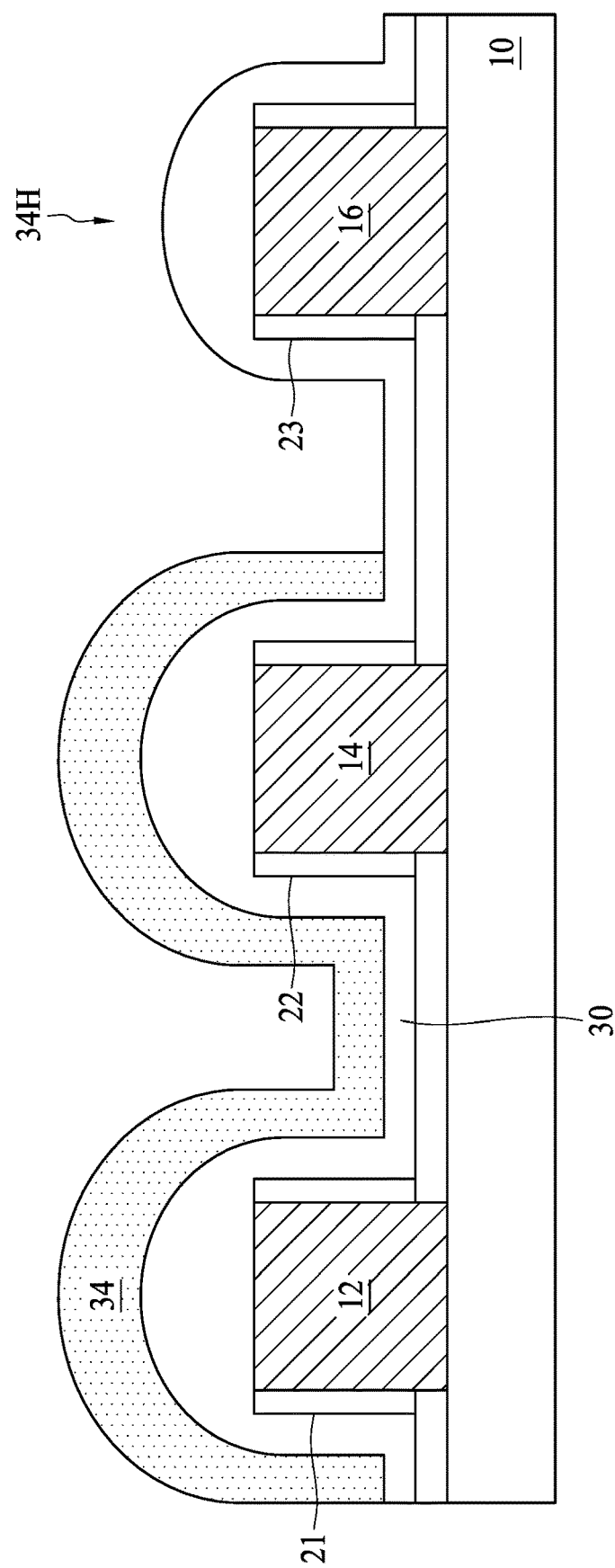
FIGS. 5A and 5B are cross-sectional views at one of various operations of manufacturing a spacer structure according to some embodiments of the present disclosure.
Figure 5B:
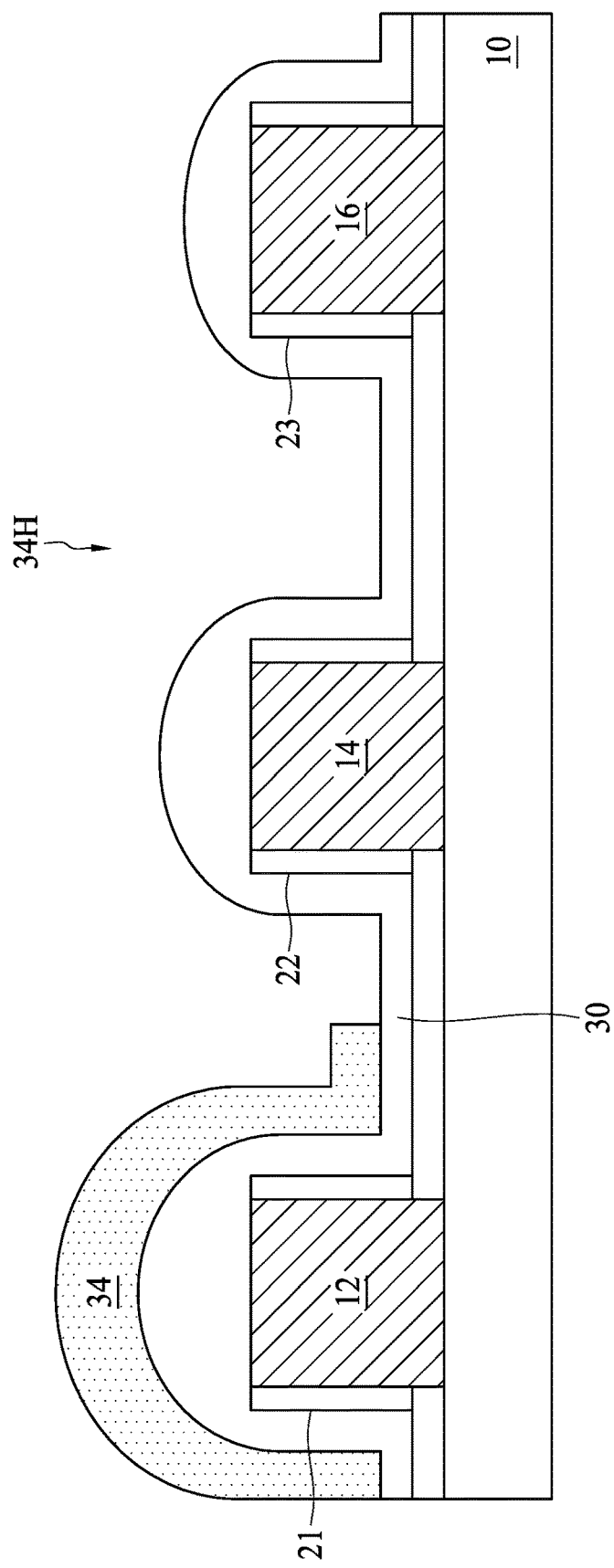

FIGS. 5A and 5B are cross-sectional views at one of various operations of manufacturing a spacer structure according to some embodiments of the present disclosure. Different from the method of FIGS. 4A-4H, in FIGS. 5A and 5B, only one hard mask layer is applied, but the hard mask layer is patterned two times to manufacture spacers with three different widths. As depicted in FIG. 5A and operation 240 in FIG. 3, the method 200 continues with operation 240 in which the dielectric layer 30 exposed by the first hard mask layer 34 is etched to reduce a thickness of the exposed dielectric layer 30 disposed over the third conductive structure 16, while the thickness of the dielectric layer 30 blocked by the first hard mask layer 34 is preserved.

As depicted in FIG. 5B and operation 250 in FIG. 3, the method 200 proceeds with operation 250 in which the dielectric layer 30 disposed over the first conductive structure 12 is blocked, and the dielectric layer 30 disposed over the second conductive structure 14 and the third conductive structure 16 is exposed. In some embodiments, operation 250 is achieved by patterning the first hard mask layer 34 again. For example, the first hard mask layer 34 is etched to remove a portion of the first hard mask layer 34, and thus the opening 34H is enlarged to expose the dielectric layer 30 disposed over the second conductive structure 14 and the third conductive structure 16. The re-patterned first hard mask layer 34 is configured as the hard mask for operation 260.

In the present embodiment, the first hard mask layer 34 is patterned in operation 230 to form the opening 34H exposing the dielectric layer 30 disposed over the third conductive structure 16. The first hard mask layer 34, without any removing operation of which, is then re-patterned in operation 250 to enlarge the opening 34H to further expose the second conductive structure 14 as well as the third conductive structure 16.

As depicted in FIG. 5B and operation 260 in FIG. 3, the method 200 proceeds with operation 260 in which the exposed dielectric layer 30 is etched to reduce the thickness of the exposed dielectric layer 30 disposed over the second conductive structure 14 and the third conductive structure 16.

The method 200 continues with operations 270 and 280 to form the spacer structure with different spacer widths.

Figure 6A:
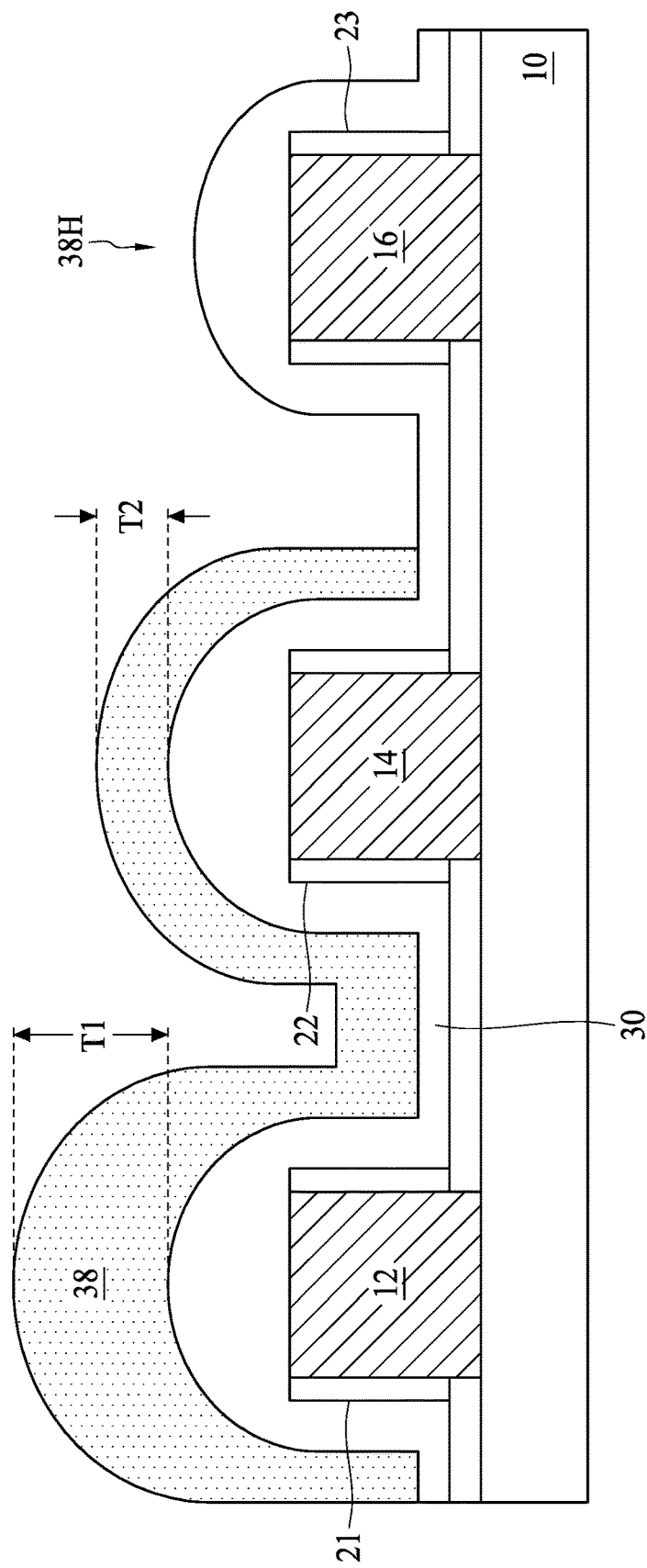
FIGS. 6A and 6B are cross-sectional views at one of various operations of manufacturing a spacer structure according to some embodiments of the present disclosure.
Figure 6B:
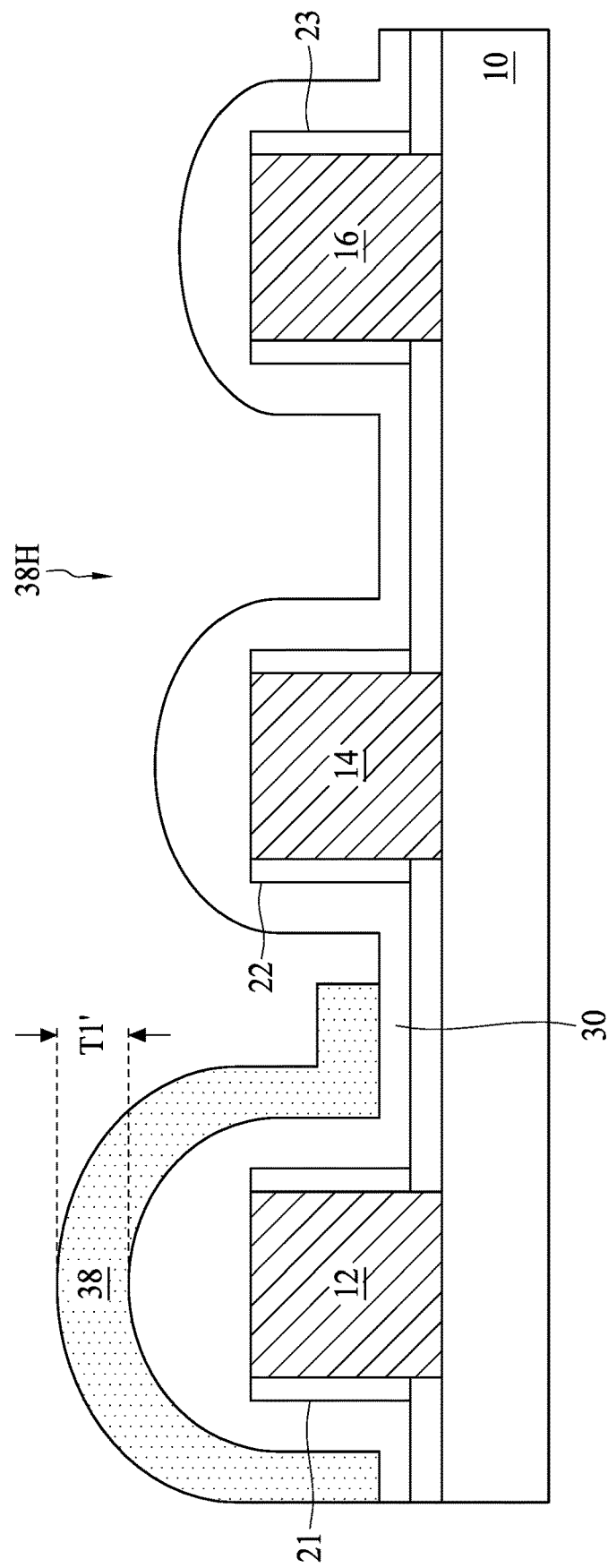

FIGS. 6A and 6B are cross-sectional views at one of various operations of manufacturing a spacer structure according to some embodiments of the present disclosure. Different from the method of FIGS. 4A-4H, in FIGS. 6A and 65B, a mask layer with different thicknesses is applied to manufacture spacers with three different widths. As depicted in FIG. 6A and operation 230 in FIG. 3, the method 200 proceeds with operation 230 in which the dielectric layer 30 disposed over the first conductive structure 12 and the second conductive structure 14 is blocked, and the dielectric layer 30 disposed over the third conductive structure 16 is exposed. In some embodiments, operation 230 is achieved by forming a mask layer such as a photoresist layer 38 having a first thickness T1 corresponding to the first conductive structure 12 and a second thickness T2 corresponding to the second conductive structure 14, wherein the second thickness T2 is less than the first thickness T1. In some embodiments, the photoresist layer 38 is formed by photolithography using a halftone mask, phase shift mask or the like. The photoresist layer 38 has an opening 38H exposing the dielectric layer 30 disposed over the third conductive structure 16. In some alternative embodiments, the mask layer can be a hard mask layer having different thicknesses, which can be achieved by, for example, multiple depositing operations.

As depicted in FIG. 6A and operation 240 in FIG. 3, the method 200 continues with operation 240 in which the dielectric layer 30 exposed by the photoresist layer 38 is etched to reduce a thickness of the exposed dielectric layer 30 disposed over the third conductive structure 16, while the thickness of the dielectric layer 30 blocked by the first hard mask layer 34 is preserved.

As depicted in FIG. 6B and operation 250 in FIG. 3, the method 200 continues with operation 250 in which the dielectric layer 30 disposed over the first conductive structure 12 is blocked, and the dielectric layer 30 disposed over the second conductive structure 14 and the third conductive structure 16 is exposed. In some embodiments, operation 250 is achieved by removing a portion of the photoresist layer 38. For example, the thickness of the photoresist layer 38 corresponding to the first conductive structure 12 is reduced to T1' and the portion of the photoresist layer 38 corresponding to the second conductive structure 14 is removed by ashing. In some embodiments, the ashing of the photoresist layer 38 is implemented by plasma such as oxygen plasma. Accordingly, the opening 38H is enlarged to further expose the dielectric layer 30 disposed over the second conductive structure 14. The photoresist layer 38 after ashing is configured as the hard mask for operation 260.

As depicted in FIG. 6B and operation 260 in FIG. 3, the method 200 proceeds with operation 260 in which the exposed dielectric layer 30 is etched to reduce the thickness of the exposed dielectric layer 30 disposed over the second conductive structure 14 and the third conductive structure 16.

The method 200 continues with operations 270 and 280 to form the spacer structures with different widths.

In the present disclosure, the spacer structure having sidewall spacers with different widths are fabricated with the same dielectric layer. The spacer structure of the present disclosure is self-aligned, less complex and compatible with standard integrated circuit fabrication. The spacer structure with different spacer widths are configured as the sidewall spacers of different semiconductor devices with different applied voltages such as low voltage MOSFET device and high voltage MOSFET device. Alternatively, one of the spacers with a first spacer width and another one of the spacers with a second spacer width may be applied to a PMOS device and an NMOS device of a CMOS device. One of the spacers with a first spacer width may also be applied to one device of a specific circuit on a wafer including power management circuit, display driving circuit, image or voice processing circuit, digital circuit, analogic circuit, or any other circuits, while another one of the spacers with a second spacer width may be applied to another device of a specific circuit on a wafer including power management circuit, display driving circuit, image or voice processing circuit, digital circuit, analogic circuit, or any other circuits. Also, the spacer structures with different spacer widths may also be applied to different semiconductor devices of different functionalities or appliances to adjust leakage current such as gate induced drain leakage (GIDL).

In one exemplary aspect, a method for manufacturing spacer structures is provided. The method includes the following operations. A substrate is received. A first conductive structure and a second conductive structure are formed over the substrate. A dielectric layer is formed to cover the first conductive structure and the second conductive structure. A hard mask layer is formed over the dielectric layer, wherein the hard mask layer covers the dielectric layer over the first conductive structure, and the hard mask layer has an opening exposing the dielectric layer over the second conductive structure. The dielectric layer exposed by the hard mask layer is etched to reduce a thickness of the dielectric layer. The hard mask layer is removed. The dielectric layer is etched to form a first main spacer on a sidewall of the first conductive structure and a second main spacer on a sidewall of the second conductive structure. A first width of the first main spacer is greater than a second width of the second main spacer.

In another exemplary aspect, a method for manufacturing spacer structures is provided. The method includes the following operations. A first conductive structure, a second conductive structure and a third conductive structure are formed over a substrate. A dielectric layer is formed to cover the first conductive structure, the second conductive structure and the third conductive structure. The dielectric layer disposed over the first conductive structure and the second conductive structure is blocked, and the dielectric layer disposed over the third conductive structure is exposed. The exposed dielectric layer is etched to reduce a thickness of the exposed dielectric layer disposed over the third conductive structure. The dielectric layer disposed over the first conductive structure is blocked, and the dielectric layer disposed over the second conductive structure and the third conductive structure is exposed. The exposed dielectric layer is etched to reduce the thickness of the exposed dielectric layer disposed over the second conductive structure and the third conductive structure. The dielectric layer disposed over the first conductive structure, the second conductive structure and the third conductive structure is exposed. The dielectric layer is etched to form a first main spacer on a sidewall of the first conductive structure, a second main spacer on a sidewall of the second conductive structure, and a third main spacer on a sidewall of the third conductive structure. A first width of the first main spacer is greater than a second width of the second main spacer, and the second width of the second main spacer is greater than a third width of the third main spacer.

In yet another aspect, a spacer structure is provided. The spacer structure includes a substrate, a first conductive structure, a first main spacer, a second conductive structure, and a second main spacer. The first main spacer is disposed on a sidewall of the first conductive structure, and the first main spacer having a first width. The second main spacer is disposed on a sidewall of the second conductive structure, and the second main spacer having a second width. The first width is greater than the second width.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a spacer structure, comprising:
   receiving a substrate;
   forming a first conductive structure and a second conductive structure over the substrate;
   forming a dielectric layer covering the first conductive structure and the second conductive structure;
   forming a hard mask layer over the dielectric layer, wherein the hard mask layer covers the dielectric layer over the first conductive structure, and the hard mask layer has an opening exposing the dielectric layer over the second conductive structure;
   etching the dielectric layer exposed by the hard mask layer to reduce a thickness of the dielectric layer; and
   removing the hard mask layer; and
   etching the dielectric layer to form a first main spacer on a sidewall of the first conductive structure and a second main spacer on a sidewall of the second conductive structure, wherein a first width of the first main spacer is greater than a second width of the second main spacer.

2. The method of claim 1, wherein etching the dielectric layer exposed by the hard mask layer to reduce the thickness of the dielectric layer exposed by the hard mask layer comprises dry etching.

3. The method of claim 1, wherein etching the dielectric layer exposed by the hard mask layer to reduce the thickness of the dielectric layer exposed by the hard mask layer comprises wet etching.

4. The method of claim 1, further comprising etching the dielectric layer to expose a top surface of the first conductive structure and a top surface of the second conductive structure.

5. The method of claim 1, wherein the dielectric layer comprises silicon nitride.

6. The method of claim 1, wherein the hard mask layer comprises silicon oxide.

7. The method of claim 1, further comprising forming a first liner spacer on a sidewall of the first conductive structure and a second liner spacer on a sidewall of the second conductive structure prior to forming the dielectric layer, wherein a width of the first liner spacer is substantially equal to a width of the second liner spacer.

8. The method of claim 7, wherein the first liner spacer and the second liner spacer are formed of a same dielectric layer.

9. The method of claim 7, wherein the first liner spacer and the second liner spacer comprise silicon oxide.

10. A method for manufacturing a spacer structure, comprising:
    forming a first conductive structure, a second conductive structure and a third conductive structure over a substrate;
    forming a dielectric layer covering the first conductive structure, the second conductive structure and the third conductive structure;
    blocking the dielectric layer disposed over the first conductive structure and the second conductive structure, and exposing the dielectric layer disposed over the third conductive structure;
    etching the exposed dielectric layer to reduce a thickness of the exposed dielectric layer disposed over the third conductive structure;
    blocking the dielectric layer disposed over the first conductive structure, and exposing the dielectric layer disposed over the second conductive structure and the third conductive structure;
    etching the exposed dielectric layer to reduce the thickness of the exposed dielectric layer disposed over the second conductive structure and the third conductive structure;
    exposing the dielectric layer disposed over the first conductive structure, the second conductive structure and the third conductive structure; and
    etching the dielectric layer to form a first main spacer on a sidewall of the first conductive structure, a second main spacer on a sidewall of the second conductive structure, and a third main spacer on a sidewall of the third conductive structure, wherein a first width of the first main spacer is greater than a second width of the second main spacer, and the second width of the second main spacer is greater than a third width of the third main spacer.

11. The method of claim 10, wherein the step of blocking the dielectric layer disposed over the first conductive structure and the second conductive structure and exposing the dielectric layer disposed over the third conductive structure is achieved by forming a first hard mask layer over the dielectric layer.

12. The method of claim 11, further comprising removing the first hard mask layer prior to the step of blocking the dielectric layer disposed over the first conductive structure and exposing the dielectric layer disposed over the second conductive structure and the third conductive structure.

13. The method of claim 12, wherein the step of blocking the dielectric layer disposed over the first conductive structure and exposing the dielectric layer disposed over the second conductive structure and the third conductive structure is achieved by forming a second hard mask layer over the dielectric layer.

14. The method of claim 13, wherein the step of exposing the dielectric layer disposed over the first conductive structure, the second conductive structure and the third conductive structure is achieved by removing the second hard mask layer.

15. The method of claim 12, wherein the step of blocking the dielectric layer disposed over the first conductive structure and exposing the dielectric layer disposed over the second conductive structure and the third conductive structure is achieved by patterning the first hard mask layer.

16. The method of claim 10, wherein the step of blocking the dielectric layer disposed over the first conductive structure and the second conductive structure and exposing the dielectric layer disposed over the third conductive structure is achieved by forming a photoresist layer having a first thickness corresponding to the first conductive structure and a second thickness corresponding to the second conductive structure, and the second thickness is less than the first thickness.

17. The method of claim 16, wherein the step of blocking the dielectric layer disposed over the first conductive structure and exposing the dielectric layer disposed over the second conductive structure and the third conductive structure is achieved by ashing the photoresist layer.

18. A method for manufacturing a semiconductor structure, comprising:

forming a first conductive structure and a second conductive structure over a substrate;

forming a dielectric layer conformally covering the first conductive structure and the second conductive structure;

while a masking feature is disposed over the dielectric layer over the first conductive structure, performing a first etching process of the dielectric layer over the second conductive structure to reduce a thickness of the dielectric layer; and after removing the masking feature, performing a second etching process of the dielectric layer to remove the dielectric layer from over the first conductive structure and the second conductive structure and form first spacers on sidewalls of the first conductive structure and second spacers on sidewalls of the second conductive structure.

19. The method of claim 18, wherein after the first etching process the dielectric layer having a reduced thickness is disposed over the second conductive structure.

20. The method of claim 18, wherein the second etching process forms the first spacers having a first width and the second spacers having a second width, wherein the first width is greater than the second width.

* * * * *